United States Patent
Dersch et al.

(10) Patent No.: US 10,147,659 B1
(45) Date of Patent: Dec. 4, 2018

(54) METHOD AND STRUCTURE FOR PROCESS LIMITING YIELD TESTING

(71) Applicant: GLOBALFOUNDRIES INC., Grand Cayman (KY)

(72) Inventors: Uwe Dersch, Moritzburg (DE); Ricardo P. Mikalo, Heideblick (DE); Thomas Merbeth, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/652,661

(22) Filed: Jul. 18, 2017

(51) Int. Cl.
*H01L 21/66* (2006.01)

(52) U.S. Cl.
CPC .............. *H01L 22/34* (2013.01); *H01L 22/20* (2013.01)

(58) Field of Classification Search
None
See application file for complete search history.

(56) References Cited

U.S. PATENT DOCUMENTS

| | | | |
|---|---|---|---|
| 5,751,159 A * | 5/1998 | Holm | G01R 31/2635 324/754.07 |
| 5,998,275 A | 12/1999 | Richiuso | |
| 7,554,832 B2 | 6/2009 | Fasoli et al. | |
| 8,362,480 B1 | 1/2013 | Hess et al. | |
| 2010/0213960 A1* | 8/2010 | Mok | G01R 31/2889 324/762.03 |

* cited by examiner

*Primary Examiner* — Shaun M Campbell
(74) *Attorney, Agent, or Firm* — Gibb & Riley, LLC; Anthony J. Canale

(57) ABSTRACT

Disclosed is a method of manufacturing integrated circuit (IC) chips, which includes forming routing structure(s) that facilitate process limiting yield (PLY) testing of test devices. A routing structure includes an array of link-up regions and a set of metal pads surrounding that array. Each link-up region includes two sections, each having two nodes electrically connected to the terminals of a corresponding two-terminal test device. During PLY testing with a probe card, electrical connections between the test devices and the metal pads through the link-up regions allow each test device to be tested individually. Optionally, additional routing structures with the same footprint are formed down the line and stacked one above the other. These additional routing structures are used for PLY testing with the same probe card. Optionally, dummy pads are formed between stacked routing structures to improve robustness. Also disclosed is a semiconductor structure formed according to this method.

19 Claims, 8 Drawing Sheets

METHOD AND STRUCTURE FOR PROCESS LIMITING YIELD TESTING

BACKGROUND

Field of the Invention

The present invention relates to process limiting yield (PLY) testing (i.e., yield monitoring) and, more specifically, to a method and structure for PLY testing.

Description of Related Art

More specifically, during integrated circuit manufacturing, in-line tests are performed in order to detect defects of interest (DOI) that can have a negative impact on yield. These tests, referred to as process limiting yield (PLY) tests, can be performed immediately following specific processes in the integrated circuit manufacturing line using on-wafer test structures, which include one or more devices under test (DUTs) that can be probed using, for example, a probe card. Such test structures are typically designed with one or more of the following factors in mind: device under test (DUT) sensitivity; DUT-area; DUT-testability; cost efficiency; and structural rigidity during test. DUT-sensitivity refers to coverage of defect types at issue given the particular type of DUT. DUT-area refers to a defect-capturing cross-section sufficient to ensure defect detectability. DUT-testability refers to DUT compatibility with a tester. Cost-efficiency considerations include, for example, minimizing the size of the test structures, re-using probe cards for different test structures, etc. Structural rigidity considerations include, for example, the ability to withstand probe touchdown with minimal damage. Unfortunately, in most currently available test structures used for PLY tests, there is a trade-off between the above-mentioned factors (e.g., between DUT-sensitivity and cost-efficiency; between DUT-area and cost-efficiency; cost-efficiency and structural rigidity; etc.).

SUMMARY

In view of the foregoing, disclosed herein are embodiments of a method of manufacturing integrated circuit (IC) chips, which includes the formation of routing structure(s) that facilitate process limiting yield (PLY) testing of test devices. Specifically, during integrated circuit manufacturing, a first routing structure can be formed on a semiconductor wafer and used for PLY testing with a probe card. The first routing structure can include an array of link-up regions and a set of metal pads surrounding that array. Each link-up region can include two sections, each with two nodes electrically connected to the terminals of a corresponding two-terminal test device. During PLY testing, the configuration of the routing structure allows current measurements to be taken from each test device, individually, in response to an applied voltage and further ensures that current flowing through a given test device, when tested, is not influenced by current flowing through any of the other test devices and does so without requiring the incorporation of added diodes or selection elements. Optionally, one or more additional routing structures with the same footprint can be formed down the line and stacked one above the other. The additional routing structure(s) can be used for PLY testing with the same probe card. Optionally, dummy pads can be formed between the stacked routing structures to improve structure robustness, as discussed in greater detail below. Also disclosed herein are embodiments of a semiconductor structure formed according to the above-described method.

More particularly, disclosed herein are embodiments of an integrated circuit manufacturing method that includes forming, at specific levels in the manufacturing line, one or more stacked routing structures for test devices and using the routing structure(s) for process limiting yield (PLY) testing. Specifically, the method can include forming a first routing structure on a semiconductor wafer during manufacturing of integrated circuit chips on the semiconductor wafer. This first routing structure can include a first array of link-up regions and a first set of metal pads.

The link-up regions in the first array can be arranged in a grid pattern of columns and rows and can be electrically connected to a first group of test devices and, particularly, two-terminal test devices. Each link-up region can include a first section and a second section. The first section can have first and second nodes electrically connected to the two terminals (i.e., a first pair of terminals) of a corresponding first test device. The second section can have third and fourth nodes electrically connected to the two terminals (i.e., a second pair of terminals) of a corresponding second test device.

The metal pads in the first set can surround the periphery of the first array of link-up regions. Specifically, the first set of metal pads can include first metal pads, second metal pads, third metal pads and fourth metal pads. The first metal pads can be located along a first side of the first array. The second metal pads can be located along a second side of the first array. The third metal pads can be located along a third side of the first array opposite the first side. The fourth metal pads can be located along a fourth side of the first array opposite the second side.

One of the first metal pads and one of the third metal pads can be located adjacent to opposite ends of each column of link-up regions in the first array. Furthermore, at each column, the adjacent first metal pad can be electrically connected to all first nodes in the first sections of the link-up regions in the column and, thereby to the first test devices electrically connected to those first nodes. Similarly, at each column, the adjacent third metal pad can be electrically connected to all third nodes in the second sections of the link-up regions in the column and, thereby to the second test devices electrically connected to those third nodes.

Additionally, one of the second metal pads and one of the fourth metal pads can be located adjacent to opposite ends of each row of link-up regions in the first array. Furthermore, at each row, the adjacent second metal pad can be electrically connected to all second nodes in the first sections of the link-up regions in the row and, thereby to the first test devices electrically connected to those second nodes. Similarly, at each row, the adjacent fourth metal pad can be electrically connected to all fourth nodes in the second sections of the link-up regions in the row and, thereby to the second test devices electrically connected to those fourth nodes.

The method can further include following formation of a specific metal level, which includes the link-up regions of the first array and the metal pads of the first set, using the first routing structure to perform process limiting yield (PLY) testing. Specifically, the first routing structure can be used to test those test devices that are in the first group and that are electrically connected to the metal pads in the first set at the nodes of the link-up regions in the first array.

In one exemplary embodiment, the process of using the first routing structure to test the test devices in the first group can include selecting a specific column of link-up regions from the first array, testing all first test devices electrically connected to the link-up regions of that specific column, testing all second test devices electrically connected to the link-up regions of that specific column, and iteratively repeating these processes for all columns in the first array.

Specifically, to test those first test devices that are electrically connected to the link-up regions of the specific column, a first supply voltage (e.g., a positive supply voltage) can be applied to the specific first metal pad that is connected to the first nodes in the link-up regions of the specific column. All other first metal pads, the third metal pads and the fourth metal pads can be left floating and the second metal pads can be electrically connected to a second supply voltage (e.g., ground). First current amounts at each of the second metal pads can be determined in response to these conditions and, based on the first current amounts, defects can be detected in any of the first test devices.

To test the second test devices that are electrically connected to the link-up regions of the specific column, the first supply voltage can be applied to the specific third metal pad that is connected to the third nodes in the link-up regions of the specific column. All other third metal pads, the first metal pads and the second metal pads can be left floating and the fourth metal pads can be electrically connected to the second supply voltage. Second current amounts at each of the fourth metal pads can be determined in response to these conditions and, based on the second current amounts, defects can be detected in any of the second test devices.

The above-described processes (i.e., selecting of the specific column, testing the first test devices that are electrically connected to the link-up regions of the specific column and testing the second test devices that are electrically connected to the link-up regions of the specific column) can be iteratively repeated until all of the columns in the first array have been selected and all of the test devices in the first group of test devices have been tested.

Also disclosed herein is a semiconductor structure formed according to the above-described method. This semiconductor structure can have at least one routing structure for a group of test devices. Specifically, the semiconductor structure can include a first routing structure. This first routing structure can include a first array of link-up regions and a first set of metal pads.

The link-up regions in the first array can be arranged in a grid pattern of columns and rows and can be electrically connected to a first group of test devices and, particularly, two-terminal test devices. Each link-up region can include a first section and a second section. The first section can have first and second nodes electrically connected to the two terminals (i.e., a first pair of terminals) of a corresponding first test device. The second section can have third and fourth nodes electrically connected to the two terminals (i.e., a second pair of terminals) of a corresponding second test device.

The metal pads in the first set can surround the periphery of the first array of link-up regions. Specifically, the first set of metal pads can include first metal pads, second metal pads, third metal pads and fourth metal pads. The first metal pads can be located along a first side of the first array. The second metal pads can be located along a second side of the first array. The third metal pads can be located along a third side of the first array opposite the first side. The fourth metal pads can be located along a fourth side of the first array opposite the second side.

One of the first metal pads and one of the third metal pads can be located adjacent to opposite ends of each column of link-up regions in the first array. Furthermore, at each column, the adjacent first metal pad can be electrically connected to all first nodes in the first sections of the link-up regions in the column and, thereby to the first test devices electrically connected to those first nodes. Similarly, at each column, the adjacent third metal pad can be electrically connected to all third nodes in the second sections of the link-up regions in the column and, thereby to the second test devices electrically connected to those third nodes. Additionally, one of the second metal pads and one of the fourth metal pads can be located adjacent to opposite ends of each row of link-up regions in the first array. Furthermore, at each row, the adjacent second metal pad can be electrically connected to all second nodes in the first sections of the link-up regions in the row and, thereby to the first test devices electrically connected to those second nodes. Similarly, at each row, the adjacent fourth metal pad can be electrically connected to all fourth nodes in the second sections of the link-up regions in the row and, thereby to the second test devices electrically connected to those fourth nodes.

The above-described first routing structure can be used during process limiting yield (PLY) testing following formation of a specific metal level, which includes the first array of link-up regions and the metal pads of the first set, and prior to formation of the next higher metal level.

Optionally, this semiconductor structure can further include one or more additional routing structures (e.g., a second routing structure, a third routing structure, etc.) stacked above the first routing structure. These additional routing structures can similarly be used for PLY testing. It should be noted that the arrays of link-up regions and sets of metal pads of the additional routing structures will be formed in alternating metal levels, respectively, to allow for formation, in the intermediate metal levels, of required electrical connections and also dummy pads to improve structure robustness, as discussed in greater detail below.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
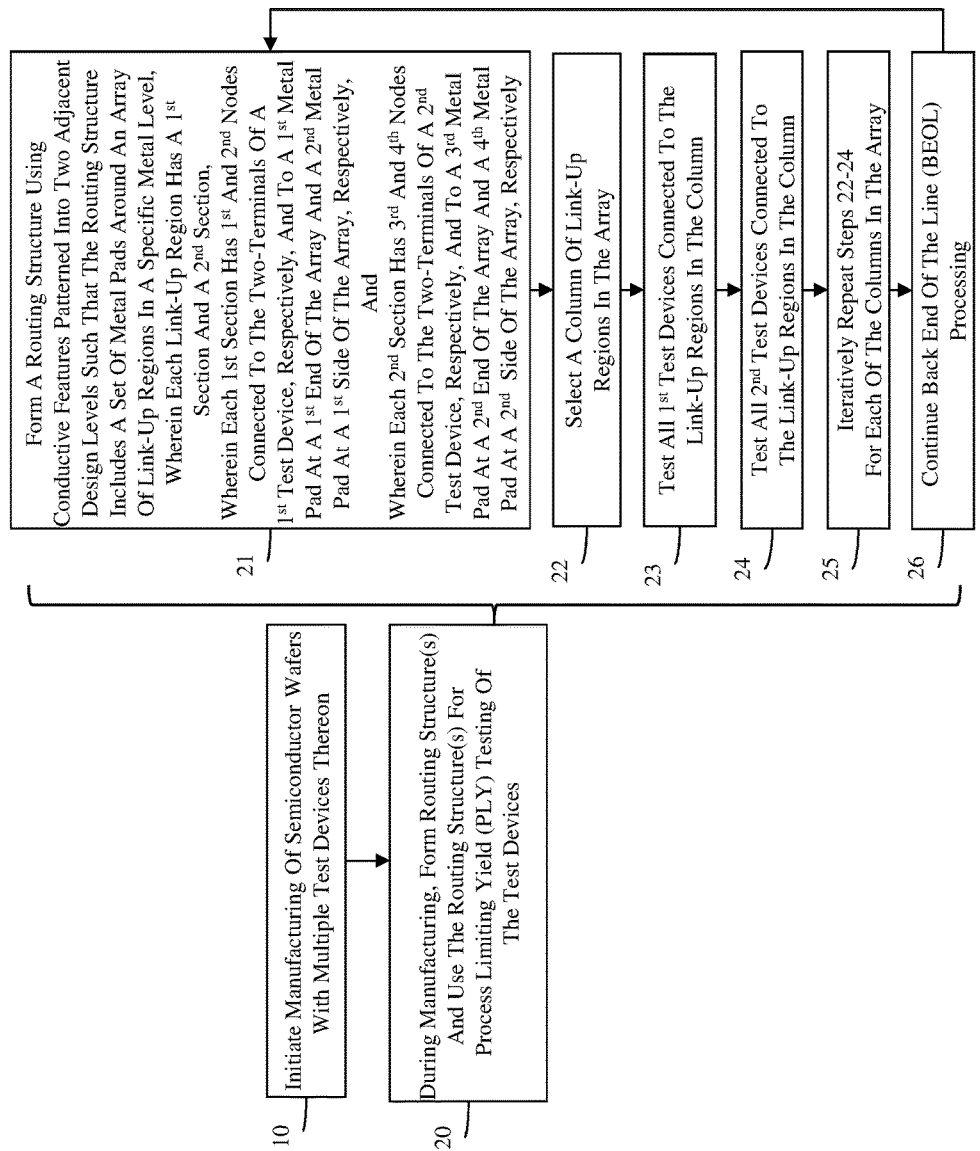
FIG. 1 is a flow diagram illustrating an integrated circuit (IC) manufacturing method.

As mentioned above, during integrated circuit manufacturing, in-line tests are performed in order to detect defects of interest (DOI) that can have a negative impact on yield. These tests, referred to as process limiting yield (PLY) tests, can be performed immediately following specific processes in the integrated circuit manufacturing line using on-wafer test structures, which include one or more devices under test (DUTs) that can be probed using, for example, a probe card. Such test structures are typically designed with one or more of the following factors in mind: device under test (DUT) sensitivity; DUT-area; DUT-testability; cost efficiency; and structural rigidity during test. DUT-sensitivity refers to coverage of defect types at issue given the particular type of DUT. DUT-area refers to a defect-capturing cross-section sufficient to ensure defect detectability. DUT-testability refers to DUT compatibility with a tester. Cost-efficiency considerations include, for example, minimizing the size of the test structures, re-using probe cards for different test structures, etc. Structural rigidity considerations include, for example, the ability to withstand probe touchdown with minimal damage. Unfortunately, in most currently available test structures used for PLY tests, there is a trade-off between the above-mentioned factors (e.g., between DUT-sensitivity and cost-efficiency; between DUT-area and cost-efficiency; cost-efficiency and structural rigidity; etc.).

In view of the foregoing, disclosed herein are embodiments of a method of manufacturing integrated circuit (IC) chips, which includes the formation of routing structure(s) that facilitate process limiting yield (PLY) testing of test devices. Specifically, during integrated circuit manufacturing, a first routing structure can be formed on a semiconductor wafer and used for PLY testing with a probe card. The first routing structure can include an array of link-up regions and a set of metal pads surrounding that array. Each link-up region can include two sections, each with two nodes electrically connected to the terminals of a corresponding two-terminal test device. During PLY testing, the configuration of the routing structure allows current measurements to be taken from each test device, individually, in response to an applied voltage and further ensures that current flowing through a given test device, when tested, is not influenced by current flowing through any of the other test devices and does so without requiring the incorporation of added diodes or selection elements. Optionally, one or more additional routing structures with the same footprint can be formed down the line and stacked one above the other. The additional routing structure(s) can be used for PLY testing with the same probe card. Optionally, dummy pads can be formed between the stacked routing structures to improve structure robustness, as discussed in greater detail below. Also disclosed herein are embodiments of a semiconductor structure formed according to the above-described method.

FIG. 1 is a flow diagram illustrating an integrated circuit (IC) manufacturing method. In the manufacturing method, manufacturing of IC chips on a semiconductor wafer according to a design is initiated (see process 10 of FIG. 1). During manufacturing, in addition to manufacturing the various devices for the IC chips, multiple test devices and one or more routing structures for one or more groups of those test devices, respectively, can be formed on the semiconductor wafer and used for process limiting yield (PLY) testing of the test devices (see process 20 of FIG. 1).

More specifically, at process 10, processing can be performed in order to form IC chips on a semiconductor wafer such that each IC chip includes a device layer and multiple design levels above the device layer. The semiconductor wafer can be, for example, a bulk semiconductor substrate 101 and the device layer 102 can be the upper portion of the bulk semiconductor substrate 101 (as shown). Alternatively, the semiconductor wafer can be a semiconductor-on-insulator wafer (e.g., a silicon-on-insulator (SOI) wafer) and the device layer 102 can be the semiconductor layer above the insulator layer. In any case, the design levels above the device layer 102 can include, but are not limited to, a polysilicon (PC) level and back end of the line (BEOL) metal levels above the PC level, including a first metal (M1) level immediately adjacent to and above the PC level, a second metal (M2) level above the M1 level, a third metal (M3) level above the M2 level, a fourth metal (M4) level above the M3 level, a fifth metal (M5) level above the M4 level, and so on until a last or uppermost metal (MX) level.

During manufacturing, one or more semiconductor devices or other types of devices for the IC chips can be formed in the device layer 102 and, optionally, in the various design levels above the device layer. Additionally, multiple test devices 190 can be formed in the device layer 102 (as shown) and, optionally, one or more of the other design levels above the device layer 102 (not shown).

In any case, these test devices 190 can be electrically isolated from each other and each test device can be a two-terminal test device, which can be tested by applying a voltage to a first terminal and measuring a current amount at a second terminal in response to the applied voltage. The two-terminal test devices can be passive two-terminal devices. Additionally or alternatively, the two-terminal test devices can be active two-terminal test devices. Exemplary two-terminal passive test devices include, but are not limited to, resistors, capacitors, inductors, comb structures, transformers and/or any other passive two-terminal test devices. Exemplary two-terminal active test devices include, but are not limited to, diodes, field effect transistor (FET)-circuits with two-terminals, static random access memory (SRAM) circuits with two-terminals and/or any other active two-terminal test devices. Furthermore, it should be noted that the test devices 190 can all be the same type of test device and can be essentially identical in design. That is, the test devices can all be one specific type of test device (e.g., all resistors, all capacitors, all inductors, etc.) with the same design (i.e., with the same dimensions, such as the same wire width, length, depth, etch. and with the same configuration). Alternatively, the test devices 190 can include two or more different types of test devices and/or two or more of the same specific type of test device, but with different designs (i.e., with different dimensions, such as different wire widths, lengths and/or depths, and/or with different configurations).

Figure 2:
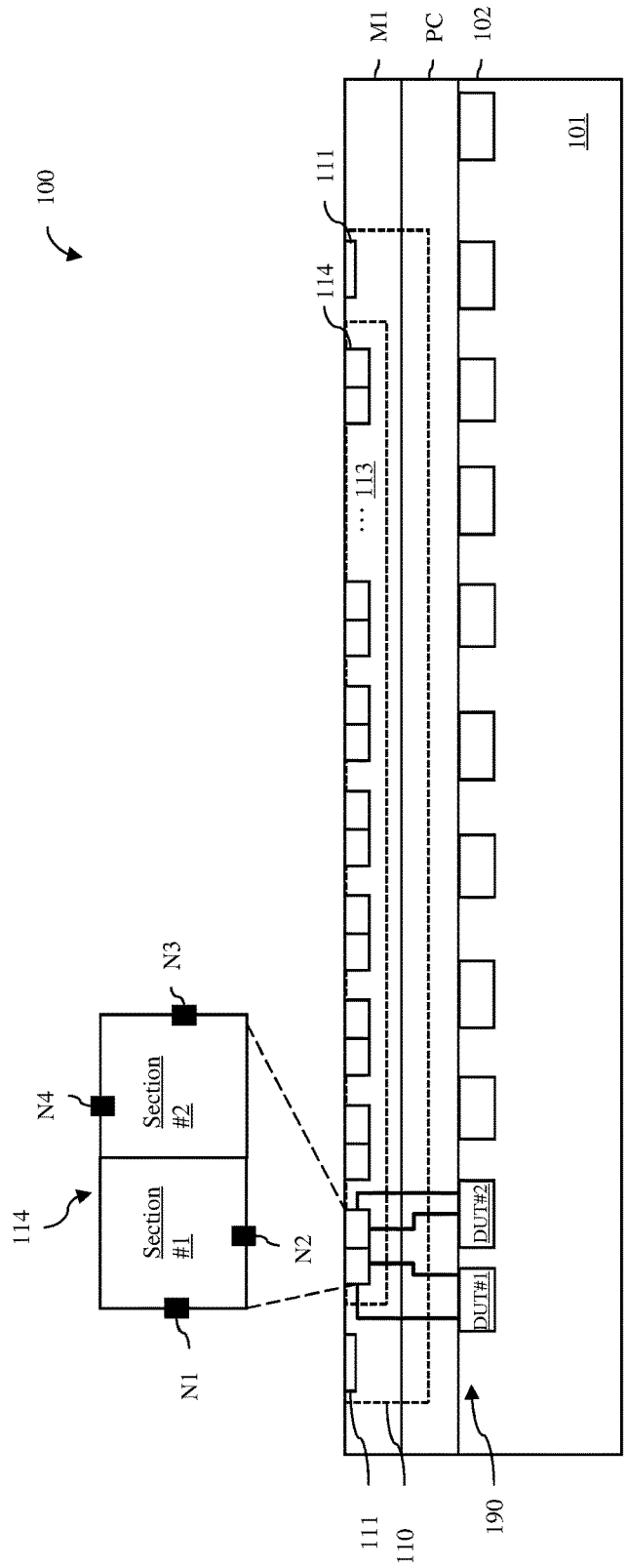
FIG. 2 is a cross-section diagram illustrating a partially completed structure formed according to the method of FIG. 1.
Figure 3:
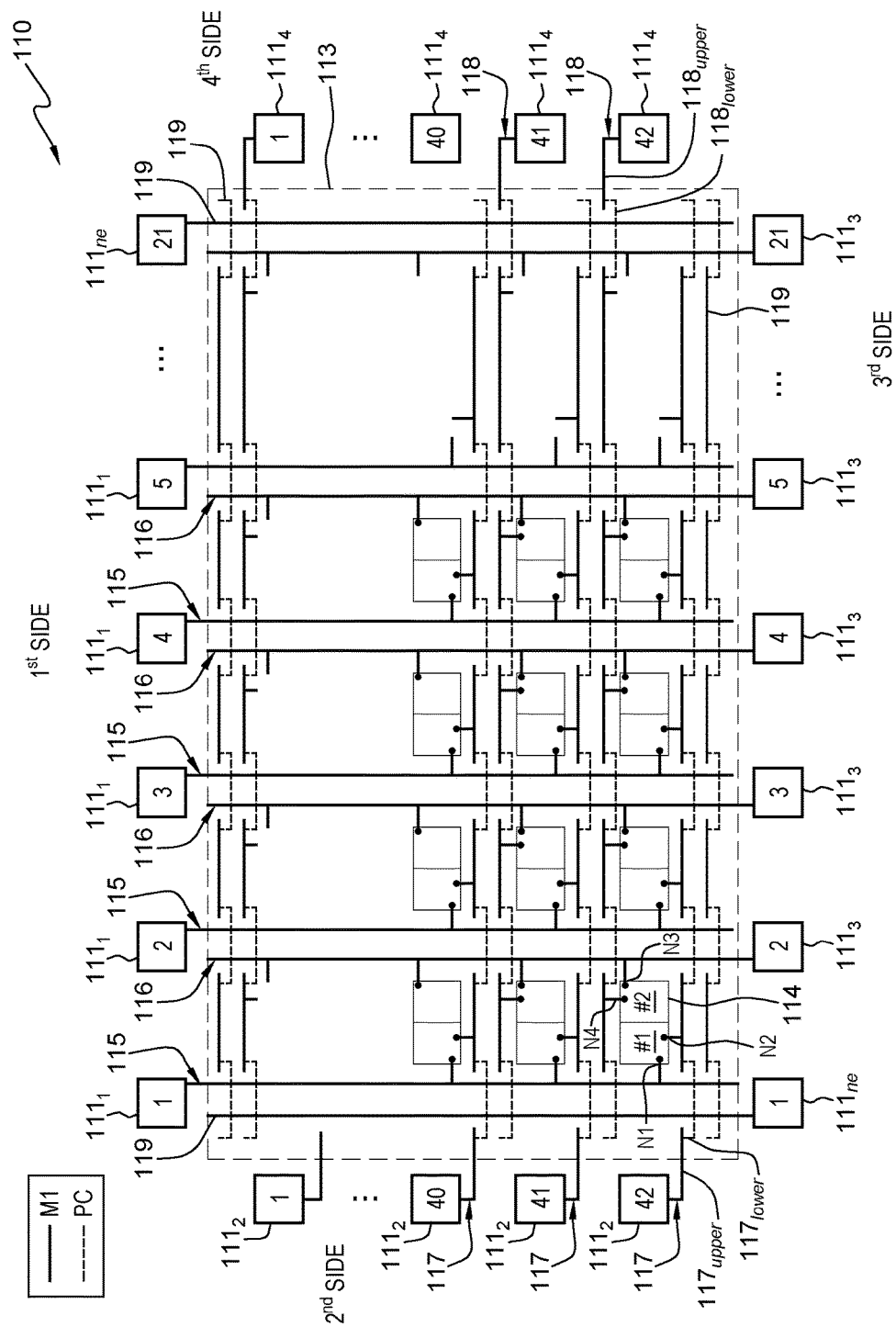
FIG. 3 is a schematic diagram further illustrating the routing structure 110 of FIG. 2.

At process 20, at least a first routing structure 110 for a first group of the test devices 190 can be formed on the semiconductor wafer (see process 21 of FIG. 1; see also the cross-section diagram of FIG. 2 and the schematic diagram of FIG. 3). The first routing structure 110 can be formed using conductive features patterned into two design levels (e.g., two adjacent design levels above the device level).

For example, the first routing structure 110 can be formed using conductive features patterned into the PC and M1 levels. Alternatively, the first routing structure 110 can be formed using conductive features patterned into two adjacent BEOL metal levels (e.g., the M2 and M3 levels, the M4 and M5 levels, etc.). For purposes of illustration, the first routing structure 110 is described below and illustrated in the figures as being formed using conductive features patterned into the PC and M1 design levels. In any case, as illustrated in FIGS. 2 and 3, the first routing structure 110 can be formed so as to include, in a specific metal level (e.g., the M1 level), a first array 113 of link-up regions 114 and a first set 111 of metal pads.

The link-up regions 114 in the first array 113 can be patterned in the specific metal level (e.g., the M1 level) such that they are arranged in a grid pattern of columns and rows. For purposes of illustration, 20 columns and 42 rows are shown. However, it should be understood that the figures are not intended to be limiting and that the first array 110 of link-up regions 114 can include any number of one or more columns and one or more rows.

Each link-up region 114 in the first array 113 can include a first section (section #1 or left section) and a second section (section #2 or right section). The first section can have first and second nodes (N1 and N2) electrically connected by vias and/or wires to the two terminals (i.e., the first pair of terminals) of a corresponding first test device (DUT#1) in the first group. The second section can have third and fourth nodes (N3 and N4) electrically connected by vias and/or wires to the two terminals (i.e., the second pair of terminals) of a corresponding second test device (DUT#2) in the first group.

To avoid clutter in the drawings, exemplary electrical connections between the nodes (N1-N4) of the two sections of a single link-up region 114 and the pairs of terminals of the two test devices (DUT#1 and DUT#2) are shown in FIG. 2. However, it should be understood that the nodes of each section of each link-up region 114 in the first array 113 can be electrically connected to the two terminals of any one of the test devices 190. It should be noted that the first group of test devices can contain a given number of the test devices equal to two times the number of link-up regions in the first array 113 (i.e., one test device for each section of each link-up region). The test devices can be the same or different, as discussed above. Additionally, for purposes of illustration, all the test devices 190 are shown only in the device layer 102 and further shown as being physically separated structures. However, it should be understood that any of the test devices in the first group can be located in the device level 102 or, alternatively, in any design level up to at the specific metal level (e.g., the M1 level), which contains the first array 113 of link-up regions 114 and the first set 111 of metal pads. Furthermore, instead of being physically separated structures, two or more of the test devices 190 could be interwoven but still electrically isolated.

The first set 111 of metal pads can surround the periphery of the first array 113 of link-up regions 114. Specifically, the first set 111 of metal pads can include: first metal pads $111_1$, second metal pads $111_2$, third metal pads $111_3$ and fourth metal pads $111_4$. The first metal pads $111_1$ can be located along a first side (e.g., the top side) of the first array 113. The second metal pads $111_2$ can be located along a second side (e.g., the left side) of the first array 113. The third metal pads $111_3$ can be located along a third side (e.g., the bottom side) of the first array 113 opposite the first side. The fourth metal pads $111_4$ can be located along a fourth side (e.g., the right side) of the first array 113 opposite the second side.

Optionally, the first set 111 of metal pads can also include one or more nonessential metal pads $111_{ne}$ including, for example, a nonessential metal pads $111_{ne}$ located at the end of the line of first metal pads $111_1$ on the first side (i.e., adjacent to the fourth side) and another nonessential metal pad $111_{ne}$ located at the beginning of the line of third metal pads $111_3$ on the third side (i.e., adjacent to the second side).

One of the first metal pads $111_1$ and one of the third metal pads $111_3$ can be located adjacent to opposite ends of each column of link-up regions 114 in the first array 113. Furthermore, at each column, the adjacent first metal pad $111_1$ can be electrically connected to all first nodes in the first sections of the link-up regions 114 in the column and, thereby to the first test devices that are also electrically connected to those first nodes. Similarly, at each column, the adjacent third metal pad $111_3$ can be electrically connected to all third nodes in the second sections of the link-up regions 114 in the column and, thereby to the second test devices that are also electrically connected to those third nodes.

Additionally, one of the second metal pads $111_2$ and one of the fourth metal pads $111_4$ can be located adjacent to opposite ends of each row of link-up regions 114 in the first array 113. Furthermore, at each row, the adjacent second metal pad $111_2$ can be electrically connected to all second nodes in the first sections of the link-up regions 114 in the row and, thereby to the first test devices that are also electrically connected to those second nodes. Similarly, at each row, the adjacent fourth metal pad $111_4$ can be electrically connected to all fourth nodes in the second sections of the link-up regions 114 in the row and, thereby to the second test devices that are also electrically connected to those fourth nodes.

The first routing structure 110 can further include first wires 115, second wires 117, third wires 116, and fourth wires 118. The first wires 115 can be oriented in a first direction (i.e., the direction of the columns of link-up regions) and can electrically connect the first metal pads $111_1$ to the first nodes of the first sections of the link-up regions 114 in the first array 113. The second wires 117 can be oriented in a second direction that is essentially perpendicular to the first direction (i.e., the direction of the rows of link-up regions) and can electrically connect the second metal pads $111_2$ to the second nodes of the first sections of the link-up regions 114 in the first array 113. The third wires 116 can be oriented in the first direction and can electrically connect the third metal pads $111_3$ to the third nodes of the second sections of the link-up regions 114 in the first array 113. The fourth wires 118 can be oriented in the second direction and can electrically connect the fourth metal pads $111_4$ to the fourth nodes of the second sections of the link-up regions 114 in the first array 113.

Optionally, the first routing structure 110 can further include one or more nonessential wires 119. For example, the outermost wires on the periphery of the first array 113 and, particularly, along the first side (i.e., top side), second side (i.e., left side), third side (i.e., bottom side) and fourth side (i.e., right side) of the first array 113 can be nonessential wires 119. For purposes of this disclosure, nonessential wires and nonessential metal pads refer to wires and pads that are not electrically connected to link-up regions and, thereby to test devices. For example, as illustrated, nonessential wires 119 on the second side (i.e., left side) and fourth side (i.e., right side) of the first array 113 and oriented in the first direction can be electrically connected to the nonessential metal pads $111_{ne}$ at the beginning of the line of third metal pads $111_3$ and at the end of the line of first metal pads $111_1$, respectively. Additional nonessential wires 119 on the first side (i.e., top side) and third side (i.e., bottom side) of the first array 113 and oriented in the second direction can be unconnected (i.e., not connected to any metal pads). It should be noted that the use of the nonessential wires and metal pads provides symmetry to the routing structure.

The first wires 115 and third wires 116 can be patterned in the same specific metal level as the first array 113 of link-up regions 114 and the first set 111 of metal pads (e.g., the M1 level). The first wires 115 and the third wires 116 can be patterned so as to be parallel to the columns of link-up regions 114 in the first array 113 such that each column is positioned laterally between a first wire 115 and a third wire 116.

The second wires 117 and fourth wires 118 can be parallel to the rows of link-up regions 114 in the first array 113 and can be patterned in a combination of the specific metal level (e.g., the M1 level) and a design level below the specific metal level (e.g., the polysilicon level, the device level, etc.) as discussed below, such that each row of link-up regions 114 is positioned laterally between a corresponding pair of second and fourth wires 117-118.

To ensure that the first wires 115 and the third wires 116, which are oriented in the first direction (i.e., the direction of the columns), are electrically isolated from the second wires 117 and the fourth wires 118, which are oriented in the second direction (i.e., the direction of the rows), the second wires 117 and the fourth wires 118 can each have both upper and lower sections. Specifically, the second wires 117 can each be made up of upper second wire segments $117_{upper}$ and lower second wire segments $117_{lower}$. The upper second wire segments $117_{upper}$ can be patterned in the same specific metal level that contains the first wires 115 and the third wires 116 such that they are essentially perpendicular to and between pairs of adjacent first and third wires. The lower second wire segments $117_{lower}$ can be patterned in a design level below the specific metal level such that they traverse below the first wires 115 and the third wires 116. Vias can electrically connect the upper and lower second wire segments $117_{upper}$-$117_{lower}$. Similarly, the fourth wires 118 can each be made up of upper fourth wire segments $118_{upper}$ and lower fourth wire segments $118_{lower}$. The upper fourth wire segments $118_{upper}$ can be patterned in the same specific metal level that contains the first wires 115 and the third wires 116 such that they are essentially perpendicular to and between pairs of adjacent first and third wires. The lower fourth wire segments $118_{lower}$ can be patterned in a design level below the specific metal level such that they traverse below the first wires 115 and the third wires 116. Vias can electrically connect the upper and lower fourth wire segments $118_{upper}$-$118_{lower}$. Note, with this configuration, each link-up region 114 in a row in the first array 113 will be positioned between an upper second wire segment $117_{upper}$ and an upper fourth wire segment $118_{upper}$ in the specific metal level (e.g., in the M1 level). It should be noted that the nonessential wires 119 that are oriented in the first direction can be configured in essentially the same manner as the first wires 115 and third wires 116 discussed above. Similarly, the nonessential wires 119 that are oriented in the second direction can be configured in essentially the same manner as the second wires 117 and the fourth wires 118 discussed above.

Thus, as described above and for purposes of this disclosure, the term "link-up regions" in an array of link-up regions refers to defined areas of a metal level that are arranged in a grid pattern. Each link-up region has two sections and each section contains two nodes (i.e., two interconnect points) for a total of four nodes. Each of the four nodes in a link-up region can be electrically connected (e.g., by a wire) to a different metal pad on each of the four sides of the array, respectively. Furthermore, the two terminals of one two-terminal test device can be electrically connected (e.g., by one or more vias and/or one or more wires) to the two nodes in one section of that link-up region in order to connect those two terminals to first and second side metal pads, respectively. Similarly, the two terminals of a different two-terminal test device can be electrically connected (e.g., by one or more vias and/or one or more wires) to the two nodes in the other section of the same link-up region in order to connect those two terminals to third and fourth side metal pads, respectively.

Following completion of the specific metal level (e.g., the M1 level) and, particularly, prior to formation of the next metal level (e.g., the M2 level), the first routing structure 110 can be used for PLY testing and, particularly, to detect defects in any of the test devices connected to the first array 113. Specifically, the first routing structure 110 can be used to test those test devices 190 that are in the first group of test devices and that are electrically connected to the metal pads in the first set 111 at the nodes in the link-up regions 114 in the first array 113.

The process of using the first routing structure 110 to test test devices in the first group can include selecting a specific column of link-up regions 114 in the first array 113 (see process 22 of FIG. 1), testing all first test devices electrically connected to the link-up regions 114 of that specific column (see process 23 of FIG. 1), testing all second test devices electrically connected to the link-up regions 114 of that specific column (see process 24 of FIG. 1), and iteratively repeating these processes for all columns (see process 25 of FIG. 1). To test the first test devices that are electrically connected to the link-up regions 114 in a specific column, the following processes can be performed (e.g., using a probe card). Each first test device (DUT#1) that is electrically connected to each link-up region 114 in the specific column can be individually tested. This can be accomplished by applying a first supply voltage (e.g., a positive supply voltage (Vdd)) to the specific first metal pad $111_1$, which is connected to the first nodes (N1) of the first section of each link-up region 114 in the specific column, and, at the same time, leaving all other first metal pads $111_1$ as well as the third metal pads $111_3$ and the fourth metal pads $111_4$ floating and connecting all the second metal pads $111_2$ to a second supply voltage (e.g., to ground). Then, measured first current amounts can be determined at each of the second metal pads $111_2$. Based on the measured first current amounts, defects can be detected in any of the first test devices that are electrically connected to the link-up regions 114 in that specific column. That is, for each first test device, the measured first current amount at the second metal pad, which is electrically connected to that first test device, can be compared to an expected first current amount. A difference between the measured first current amount and the expected first current amount for the first test device can indicate a defect. For example, a measured first current amount that is less than the expected current amount may be indicative of a void; whereas a measured first current amount that is greater than the expected first current amount may be indicative of a short.

To test the second test devices that are electrically connected to the link-up regions 114 in a specific column, the following processes can be performed (e.g., using the same probe card). Each second test device (DUT#2) that is electrically connected to each link-up region 114 in the specific column can be individually tested. This can be accomplished by applying the first supply voltage (e.g., the positive supply voltage (Vdd)) to the specific third metal pad $111_3$, which is connected to the third nodes (N3) of the second section of each link-up region 114 in the specific column, and, at the same time, leaving all other third metal pads $111_3$ as well as the first metal pads $111_1$ and the second metal pads $111_2$ floating and connecting all the fourth metal pads $111_4$ to the second supply voltage (e.g., to ground). Then, second current amounts can be determined at each of the fourth metal pads $111_4$. Based on the second current amounts, defects can be detected in any of second test devices that are electrically connected to the link-up regions 114 in that specific column in the same manner as discussed above with regard to the first test devices.

It should be noted that the non-essential metal pads $111_{ne}$, if present, will remain floating throughout testing of the first test devices and the second test devices.

For purposes of illustration, the first supply voltage and the second supply voltage are described as a positive supply voltage and ground, respectively. However, it should be understood that, alternatively, the first supply voltage could be ground and the second supply voltage could be a positive supply voltage.

The manner, described above, for individually testing the first test devices and the second test devices ensures that current flowing through a given device under test (DUT) is not influenced by current flowing through any of the other test devices connected to the link-up regions 114 in the first array 113 because the potential difference on the other test devices across the array is zero. One significant advantage of the disclosed routing structure configuration is that the influence of current flowing through any of the other test devices in the array on a given test device is achieved without requiring the incorporation of added diodes or other selection elements into the array.

The processes 22-24 of selecting a specific column and individually testing the first test devices and then the second test devices that are electrically connected to the link-up regions 114 in that specific column can be iteratively repeated until all of the columns in the first array 113 are selected and all of the first and second test devices connected to all of the link-up regions 114 in the first array 113 are tested (see process 25 of FIG. 1).

Additionally or alternatively, one or more similar routing structures can be formed using conductive features patterned into two BEOL metal levels above the specific metal level (e.g., above the M1 level). That is, manufacturing of the IC chips on the semiconductor wafer can continue with formation of additional BEOL metal levels (see process 26 of FIG. 1) and, during formation of the additional BEOL metal levels, processes 21-25 can be iteratively repeated. That is, additional routing structures (as discussed in greater detail below) can be formed in the metal levels above first routing structure 110 and the additional routing structure(s) can be used for PLY testing of additional group(s) of test devices in the same manner as described above.

Figure 4:
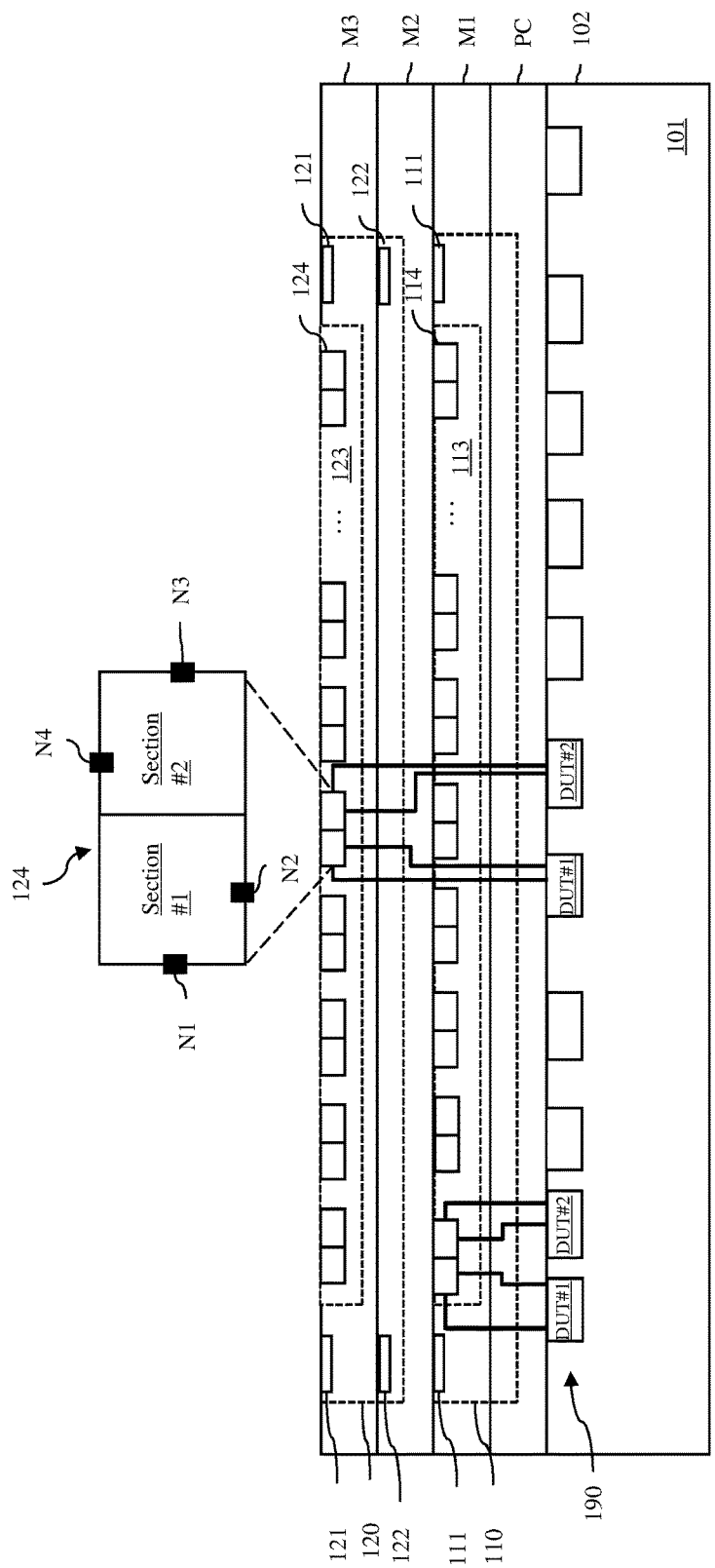
FIG. 4 is a cross-section diagram illustrating a partially completed IC structure formed according to the method of FIG. 1.
Figure 5:
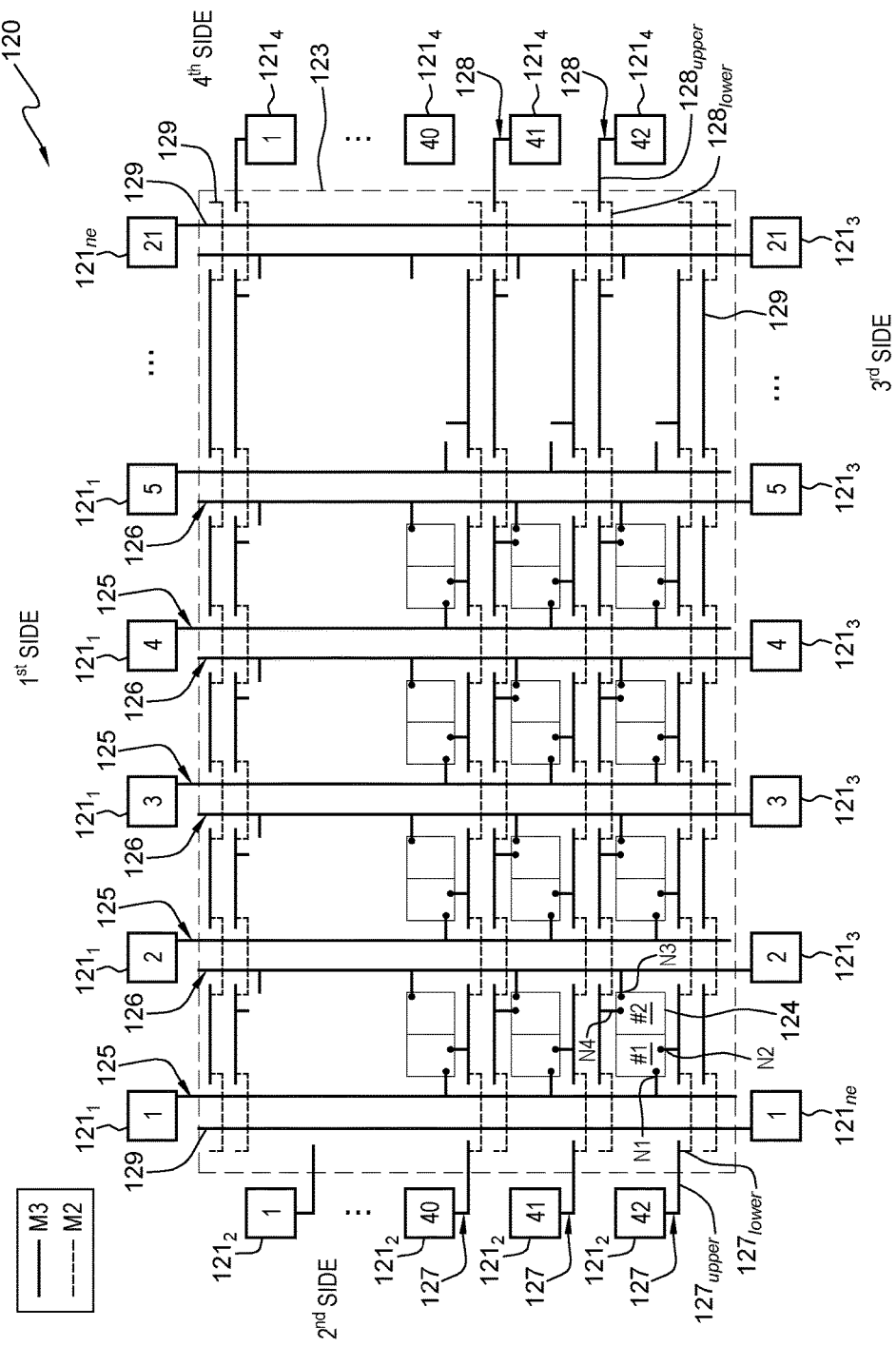
FIG. 5 is a schematic diagram further illustrating the routing structure 120 of FIG. 4.

For example, referring to the cross-section diagram of FIG. 4 and the schematic diagram of FIG. 5, the method can further include forming upper metal levels above the specific metal level (e.g., above the M1 level). These upper metal levels can include at least a first upper metal level and a second upper metal level above the first upper metal level. The first upper metal level and the second upper metal level can be, for example, the M2 level and the M3 level, respectively, as illustrated in FIG. 4. Alternatively, the first upper metal level and the second upper metal level can be any two upper metal levels, which are either immediately adjacent to each other or separated by one or more metal levels. In any case, during the forming of the first upper metal level and the second upper metal level, dummy pads 122 and a second routing structure 120 can be formed.

The dummy pads 122 can be formed in the first upper metal level (e.g., the M2 level). The dummy pads 122 can have essentially the same configuration as the metal pads (e.g., can have essentially the same size and shape as the metal). Additionally, each dummy pad can be aligned vertically above a corresponding metal pad below. The dummy pads 122 can be made of the same metal material as the metal pads. Alternatively, the dummy pads 122 can be made of a different metal material or some other suitable relatively hard protective material. In any case, the dummy pads 122 can be physically separated and electrically isolated from metal pads above or below by interlayer dielectric (ILD) material. The ILD material above and below the dummy pads 122 can be devoid of any vias.

The second routing structure 120 can be formed so as to include, in the second upper metal level (e.g., in the M3 level), both a second array 123 of link-up regions 124 and a second set 121 of metal pads. The second array 123 of link-up regions 124 and the second set 121 of metal pads can be configured essentially the same as the first array 113 of link-up regions 114 and the first set 111 of metal pads, as described above. Furthermore, the second array 123 of link-up regions 124 and the second set 121 of metal pads can be aligned above and have essentially a same footprint as the first array 113 and the first set 111 of metal pads, respectively.

That is, each link-up region 124 in the second array 123 can be aligned vertically above a link-up region 114 in the first array 113 and can include a first section (section #1 or left section) and a second section (section #2 or right section). The first section can have first and second nodes (N1 and N2) electrically connected by vias and/or wires to the two terminals (i.e., the first pair of terminals) of a corresponding first test device (DUT#1) in a second group of the test devices 190. The second section can have third and fourth nodes (N3 and N4) electrically connected by vias and/or wires to the two terminals (i.e., the second pair of terminals) of a corresponding second test device (DUT#2) in the second group.

To avoid clutter in the drawings, exemplary electrical connections between the nodes (N1-N4) of the two sections of a single link-up region 124 and the pairs of terminals of two test devices (DUT#1 and DUT#2) are shown in FIG. 4. However, it should be understood that the nodes of each section of each link-up region 124 in the second array 123 can be electrically connected to the two terminals of any one of the test devices 190.

The second set 121 of metal pads can surround the periphery of the second array 123 of link-up regions 124 and each metal pad in the second set 121 can be aligned vertically above a corresponding dummy pad and, thereby above a corresponding metal pad in the first set 111. In any case, like the first set, the second set 121 of metal pads can include: first metal pads $121_1$, second metal pads $121_2$, third metal pads $121_3$ and fourth metal pads $121_4$. The first metal pads $121_1$ can be located along a first side (e.g., the top side) of the second array 123. The second metal pads $121_2$ can be located along a second side (e.g., the left side) of the second array 123. The third metal pads $121_3$ can be located along a third side (e.g., the bottom side) of the second array 123 opposite the first side. The fourth metal pads $121_4$ can be located along a fourth side (e.g., the right side) of the second array 123 opposite the second side.

Optionally, the second set 121 of metal pads can also include one or more nonessential metal pads $121_{ne}$ including, for example, a nonessential metal pad $121_{ne}$ located at the end of the line of first metal pads $121_1$ on the first side (i.e., adjacent to the fourth side) and another nonessential metal pad $121_{ne}$ located at the beginning of the line of third metal pads $121_3$ on the third side (i.e., adjacent to the second side).

One of the first metal pads $121_1$ and one of the third metal pads $121_3$ in the second set 121 can be located adjacent to opposite ends of each column of link-up regions 124 in the second array 123. Furthermore, at each column, the adjacent first metal pad $121_1$ can be electrically connected to all first nodes in the first sections of the link-up regions 124 in the column and, thereby to the first test devices that are also electrically connected to those first nodes. Similarly, at each column, the adjacent third metal pad $121_3$ can be electrically connected to all third nodes in the second sections of the link-up regions 124 in the column and, thereby to the second test devices that are also electrically connected to those third nodes.

Additionally, one of the second metal pads $121_2$ and one of the fourth metal pads $121_4$ can be located adjacent to opposite ends of each row of link-up regions 124 in the second array 123. Furthermore, at each row, the adjacent second metal pad $121_2$ can be electrically connected to all second nodes in the first sections of the link-up regions 124 in the row and, thereby to the first test devices that are also electrically connected to those second nodes. Similarly, at each row, the adjacent fourth metal pad $121_4$ can be electrically connected to all fourth nodes in the second sections of the link-up regions 124 in the row and, thereby to the second test devices that are also electrically connected to those fourth nodes.

The second routing structure 120 can further include first wires 125, second wires 127, third wires 126, and fourth wires 128. The first wires 125 can be oriented in a first direction (i.e., the direction of the columns of link-up regions) and can electrically connect the first metal pads $121_1$ to the first nodes of the first sections of the link-up regions 124 in the second array 123. The second wires 127 can be oriented in a second direction that is essentially perpendicular to the first direction (i.e., the direction of the rows of link-up regions) and can electrically connect the second metal pads $121_2$ to the second nodes of the first sections of the link-up regions 124 in the second array 123. The third wires 126 can be oriented in the first direction and can electrically connect the third metal pads $121_3$ to the third nodes of the second sections of the link-up regions 124 in the second array 123. The fourth wires 128 can be oriented in the second direction and can electrically connect the fourth metal pads $121_4$ to the fourth nodes of the second sections of the link-up regions 124 in the second array 123.

Optionally, the second routing structure 120 can further include one or more nonessential wires 129. For example, the outermost wires on the periphery of the second array 123 and, particularly, along the first side (i.e., top side), second side (i.e., left side), third side (i.e., bottom side) and fourth side (i.e., right side) of the second array 123 can be nonessential wires 129. As mentioned above, for purposes of this disclosure, nonessential wires and nonessential metal pads refer to wires and pads that are not electrically connected to link-up regions and, thereby to test devices. For example, as illustrated, nonessential wires 129 on the second side (i.e., left side) and fourth side (i.e., right side) of the second array 123 and oriented in the first direction can be electrically connected to the nonessential metal pads $121_{ne}$ at the beginning of the line of third metal pads $121_3$ and at the end of the line of first metal pads $121_1$, respectively. Additional nonessential wires 129 on the first side (i.e., top side) and third side (i.e., bottom side) of the second array 123 and oriented in the second direction can be unconnected (i.e., not connected to any metal pads). As mentioned above, the use of the nonessential wires and metal pads provides symmetry to the routing structure.

The first wires 125 and third wires 126 can be patterned in the same second upper metal level as the second array 123 of link-up regions 124 and the second set 121 of metal pads (e.g., the M3 level). The first wires 125 and the third wires 126 can be patterned so as to be parallel to the columns of link-up regions 124 in the second array 123 such that each column is positioned laterally between a first wire 125 and a third wire 126.

The second wires 127 and fourth wires 128 can be parallel to the rows of link-up regions 124 in the second array 123 and can be patterned in a combination of the second upper metal level (e.g., the M3 level) and the first upper metal level, which is below the second upper metal level (e.g., the M2 level), as discussed below, such that each row of link-up regions 124 is positioned laterally between a corresponding pair of second and fourth wires 127-128.

To ensure that the first wires 125 and the third wires 126, which are oriented in a first direction (i.e., the direction of the columns), are electrically isolated from the second wires 127 and the fourth wires 128, which are oriented in a second direction (i.e., the direction of the rows), the second wires 127 and the fourth wires 128 can each have both upper sections, which are patterned in the second upper metal level (e.g., the M3 level), and lower sections, which are patterned in the first upper metal level (e.g., the M2 level) and which are electrically connected to the upper sections by vias in order to form the completed wire structures. See upper and lower second wire sections $127_{upper}$ and $127_{lower}$ and upper and lower fourth wire sections $128_{upper}$-$128_{lower}$. It should be noted that the nonessential wires 129 that are oriented in the first direction can be configured in essentially the same manner as the first wires 125 and third wires 126 discussed above. Similarly, the nonessential wires 129 that are oriented in the second direction can be configured in essentially the same manner as the second wires 127 and the fourth wires 128 discussed above.

Following completion of the second upper metal level (e.g., the M3 level) and, particularly, prior to the formation of the next higher upper metal level, the second routing structure 120 can be used for PLY testing and, particularly, to detect defects in any of the test devices connected to the second array 123. Specifically, the second routing structure 120 can be used to test those test devices 190 that are in the second group of test device and that are electrically connected to the metal pads in the second set at the nodes in the link-up regions 124 in the second array 123. This process of using the second routing structure 120 to perform PLY testing can be performed in essentially the same manner as described above with regard to the first routing structure 110 (see processes 22-25 of FIG. 1). Additionally, since, as mentioned above, the second routing structure 120 is formed so as to have essentially the same footprint as the first routing structure 110 and, particularly, since the metal pads of the second set 121 in the second routing structure 120 are aligned vertically above the metal pads in the first set 111 of the first routing structure 110, the same probe card can be used for testing with both the first routing structure 110 and the second routing structure 120. Furthermore, during PLY testing using the second routing structure 120, the dummy pads 122 provide protection against probe punch-through down to the metal pads in the first set 111, thereby keeping the second routing structure 120 electrically isolated from the first routing structure 110 and improving structure robustness.

Figure 6:
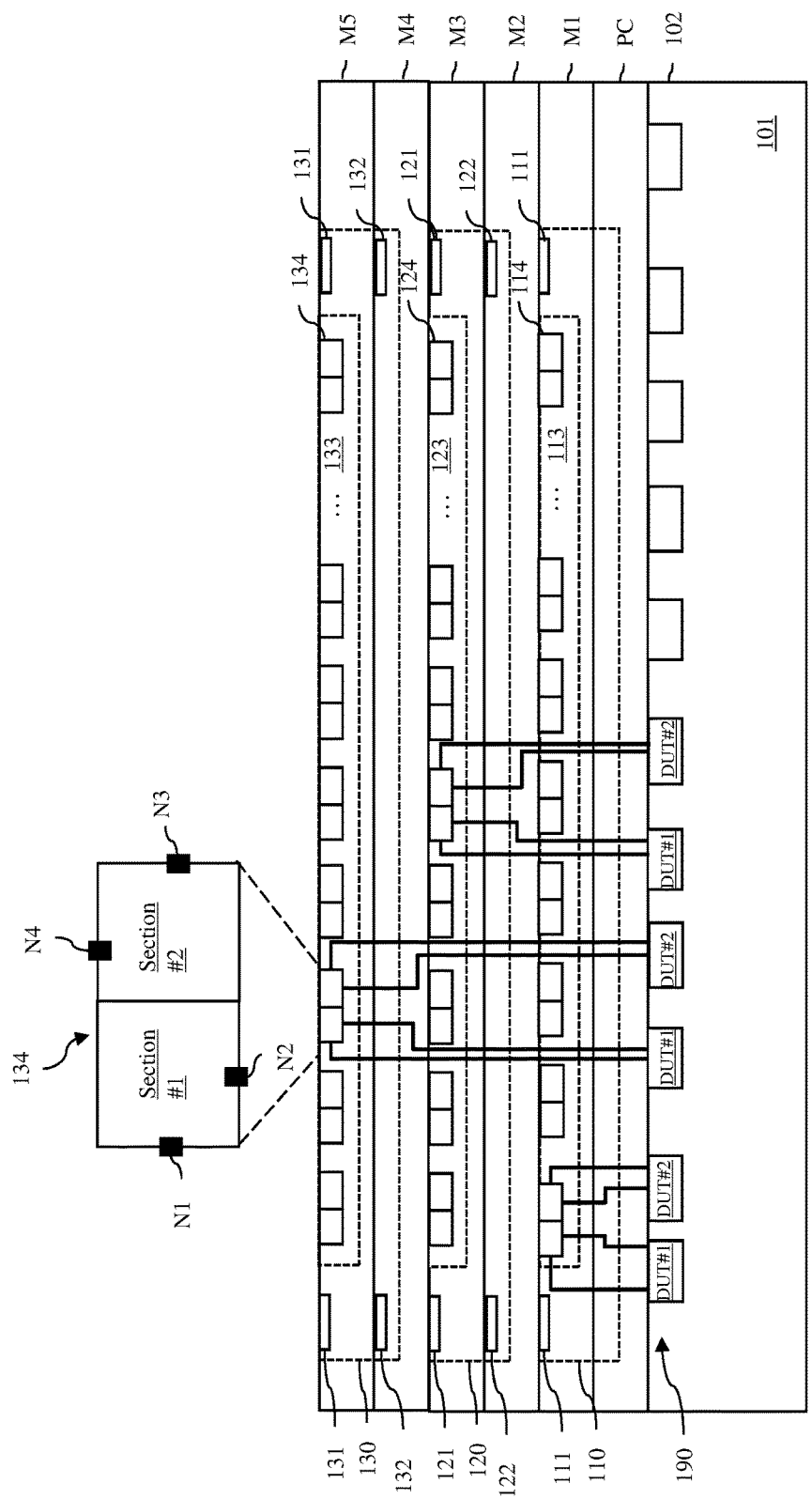
FIG. 6 is a cross-section diagram illustrating a partially completed structure formed according to the method of FIG. 1.
Figure 7:
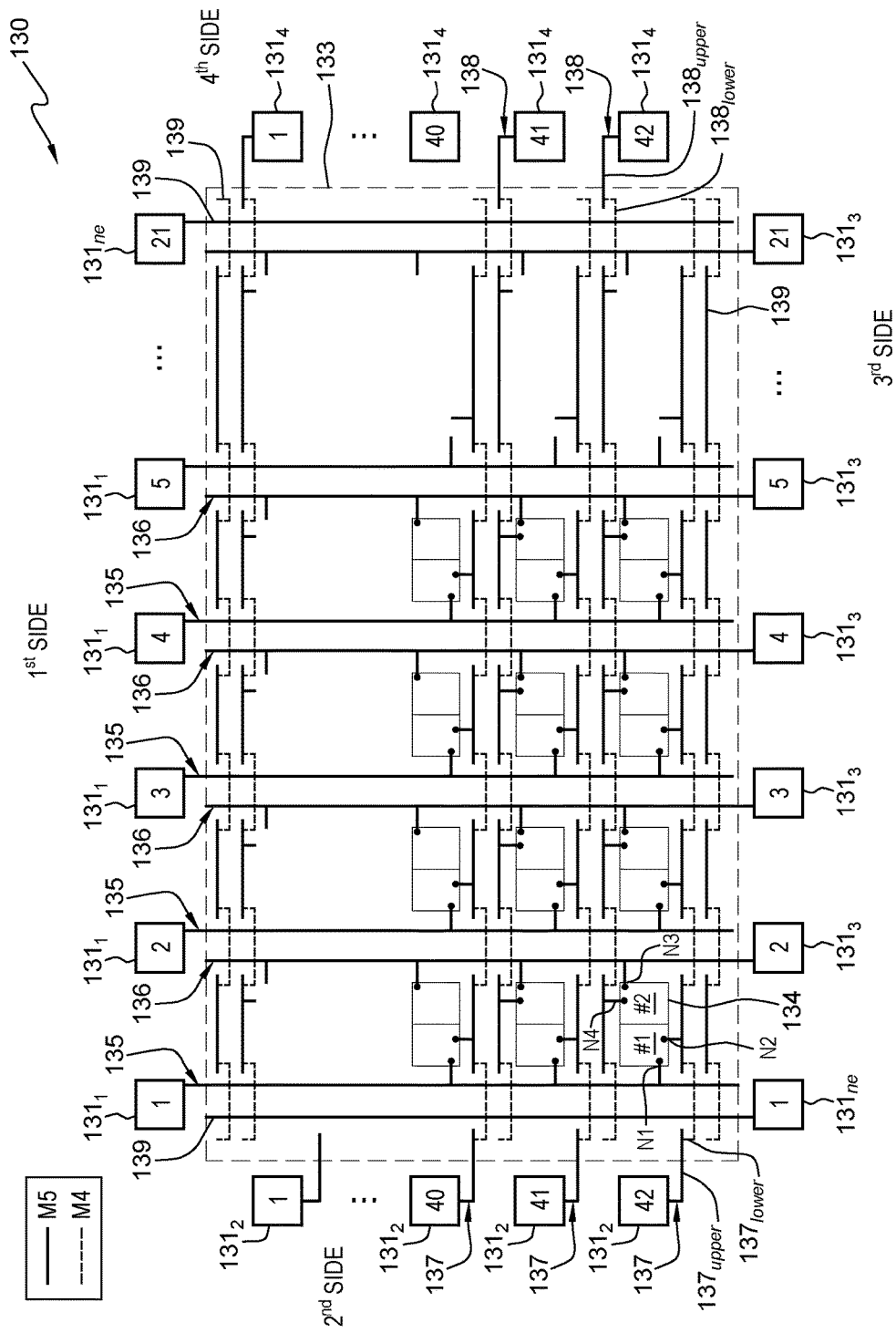
FIG. 7 is a schematic diagram further illustrating the routing structure 130 of FIG. 6; and, FIG. 8 is a cross-section diagram illustrating a semiconductor structure formed according to the method of FIG. 1.

Similarly, referring to the cross-section diagram of FIG. 6 and the schematic diagram of FIG. 7, the method can further include forming additional upper metal levels above the second upper metal level (e.g., above the M3 level). These upper metal levels can include at least a third upper metal level and a fourth upper metal level above the third upper metal level. The third upper metal level and the fourth upper metal level can be, for example, the M4 level and the M5 level, respectively, as illustrated in FIG. 6. Alternatively, the third upper metal level and the fourth upper metal level can be any two upper metal levels, which are either immediately adjacent to each other or separated by one or more metal levels. In any case, during the forming of the third upper metal level and the fourth upper metal level, additional dummy pads 132 and a third routing structure 130 can be formed.

The additional dummy pads 132 can be formed in the third upper metal level (e.g., the M4 level). The additional dummy pads 132 can have essentially the same configuration as the metal pads (e.g., each additional dummy pad can have essentially the same size and shape as the metal pads below). Additionally, each additional dummy pad can be aligned vertically above a corresponding metal pad below. The additional dummy pads 132 can be made of the same metal material as the metal pads. Alternatively, the additional dummy pads 132 can be made of a different metal material or some other suitable relatively hard protective material. In any case, the additional dummy pads 132 can be physically separated and electrically isolated from metal pads above or below by interlayer dielectric (ILD) material. The ILD material above and below the additional dummy pads 132 can be devoid of any vias.

The third routing structure 130 can be formed so as to include, in the fourth upper metal level (e.g., in the M5 level), both a third array 133 of link-up regions 134 and a third set 131 of metal pads. The third array 133 of link-up regions 134 and the third set 131 of metal pads can be aligned above and have essentially a same footprint as the first and second arrays 113/123 and the first and second sets 111/121 of metal pads, respectively.

That is, each link-up region 134 in the third array 133 can be aligned vertically above a link-up region 124 in the second array 123 and can include a first section (section #1 or left section) and a second section (section #2 or right section). The first section can have first and second nodes (N1 and N2) electrically connected by vias and/or wires to the two terminals (i.e., the first pair of terminals) of a corresponding first test device (DUT#1) in a third group of the test devices 190. The second section can have third and fourth nodes (N3 and N4) electrically connected by vias and/or wires to the two terminals (i.e., the second pair of terminals) of a corresponding second test device (DUT#2) in the third group.

To avoid clutter in the drawings, exemplary electrical connections between the nodes (N1-N4) of the two sections of a single link-up region 134 and the pairs of terminals of two test devices (DUT#1 and DUT#2) are shown in FIG. 6. However, it should be understood that the nodes of each section of each link-up region 134 in the third array 133 can be electrically connected to the two terminals of any one of the test devices 190.

The third set 131 of metal pads can surround the periphery of the third array 133 of link-up regions 134 and each metal pad in the third set 131 can be aligned vertically above a corresponding additional dummy pad 132 and, thereby above a corresponding metal pad in the second set 121. In any case, like the first and second sets, the third set 131 of metal pads can include: first metal pads $131_1$, second metal pads $131_2$, third metal pads $131_3$ and fourth metal pads $131_4$. The first metal pads $131_1$ can be located along a first side (e.g., the top side) of the third array 133. The second metal pads $131_2$ can be located along a second side (e.g., the left side) of the third array 133. The third metal pads $131_3$ can be located along a third side (e.g., the bottom side) of the third array 133 opposite the first side. The fourth metal pads $131_4$ can be located along a fourth side (e.g., the right side) of the third array 133 opposite the second side.

Optionally, the third set 131 of metal pads can also include one or more nonessential metal pads $131_{ne}$ including, for example, a nonessential metal pad $131_{ne}$ located at the end of the line of first metal pads $131_1$ on the first side (i.e., adjacent to the fourth side) and another nonessential metal pad $131_{ne}$ located at the beginning of the line of third metal pads $131_3$ on the third side (i.e., adjacent to the second side).

One of the first metal pads $131_1$ and one of the third metal pads $131_3$ in the third set 131 can be located adjacent to opposite ends of each column of link-up regions 134 in the third array 133. Furthermore, at each column, the adjacent first metal pad $131_1$ can be electrically connected to all first nodes in the first sections of the link-up regions 134 in the column and, thereby to the first test devices that are also electrically connected to those first nodes. Similarly, at each column, the adjacent third metal pad $131_3$ can be electrically connected to all third nodes in the second sections of the link-up regions 134 in the column and, thereby to the second test devices that are also electrically connected to those third nodes.

Additionally, one of the second metal pads $131_2$ and one of the fourth metal pads $131_4$ can be located adjacent to opposite ends of each row of link-up regions 134 in the third array 133. Furthermore, at each row, the adjacent second metal pad $131_2$ can be electrically connected to all second nodes in the first sections of the link-up regions 134 in the row and, thereby to the first test devices that are also electrically connected to those second nodes. Similarly, at each row, the adjacent fourth metal pad $131_4$ can be electrically connected to all fourth nodes in the second sections of the link-up regions 134 in the row and, thereby to the second test devices that are also electrically connected to those fourth nodes.

The third routing structure 130 can further include first wires 135, second wires 137, third wires 136, and fourth wires 138. The first wires 135 can be oriented in a first direction (i.e., the direction of the columns of link-up regions) and can electrically connect the first metal pads $131_1$ to the first nodes of the first sections of the link-up regions 134 in the third array 133. The second wires 137 can be oriented in a second direction that is essentially perpendicular to the first direction (i.e., in the direction of the rows of link-up regions) and can electrically connect the second metal pads $131_2$ to the second nodes of the first sections of the link-up regions 134 in the third array 133. The third wires 136 can be oriented in the first direction and can electrically connect the third metal pads $131_3$ to the third nodes of the second sections of the link-up regions 134 in the third array 133. The fourth wires 138 can be oriented in the second direction and can electrically connect the fourth metal pads $131_4$ to the fourth nodes of the second sections of the link-up regions 134 in the third array 133.

Optionally, the third routing structure 130 can further include one or more nonessential wires 139. For example, the outermost wires on the periphery of the third array 133 and, particularly, along the first side (i.e., top side), second side (i.e., left side), third side (i.e., bottom side) and fourth side (i.e., right side) of the third array 133 can be nonessential wires 139. As mentioned above, for purposes of this disclosure, nonessential wires and nonessential metal pads refer to wires and pads that are not electrically connected to link-up regions and, thereby to test devices. For example, as illustrated, nonessential wires 139 on the second side (i.e., left side) and fourth side (i.e., right side) of the third array 133 and oriented in the first direction can be electrically connected to the nonessential metal pads $131_{ne}$ at the beginning of the line of third metal pads $131_3$ and at the end of the line of first metal pads $131_1$, respectively. Additional nonessential wires 139 on the first side (i.e., top side) and third side (i.e., bottom side) of the third array 133 and oriented in the second direction can be unconnected (i.e., not connected to any metal pads). It should be noted that the use of the nonessential wires and metal pads provides symmetry to the routing structure.

The first wires 135 and third wires 136 can be patterned in the same fourth upper metal level as the third array 133 of link-up regions 134 and the third set 131 of metal pads (e.g., the M5 level). The first wires 135 and the third wires 136 can be patterned so as to be parallel to the columns of link-up regions 134 in the third array 133 such that each column is positioned laterally between a first wire 135 and a third wire 136.

The second wires 137 and fourth wires 138 can be parallel to the rows of link-up regions 134 in the third array 133 and can be patterned in a combination of the fourth upper metal level (e.g., the M5 level) and the third upper metal level, which is below the fourth upper metal level (e.g., the M4 level), as discussed below, such that each row of link-up regions 134 is positioned laterally between a corresponding pair of second and fourth wires 137-138.

To ensure that the first wires 135 and the third wires 136, which are oriented in a first direction (i.e., the direction of the columns), are electrically isolated from the second wires 137 and the fourth wires 138, which are oriented in a second direction (i.e., the direction of the rows), the second wires 137 and the fourth wires 138 can each have both upper sections, which are patterned in the fourth upper metal level (e.g., the M5 level), and lower sections, which are patterned in the third upper metal level (e.g., the M4 level) and which are electrically connected to the upper sections by vias in order to form the completed wire structures. See upper and lower second wire sections $137_{upper}$ and $137_{lower}$ and upper and lower fourth wire sections $138_{upper}$-$138_{lower}$. It should be noted that the nonessential wires 139 that are oriented in the first direction can be configured in essentially the same manner as the first wires 135 and third wires 136 discussed above. Similarly, the nonessential wires 139 that are oriented in the second direction can be configured in essentially the same manner as the second wires 137 and the fourth wires 138 discussed above.

Following completion of the fourth upper metal level (e.g., the M5 level) and, particularly, prior to the formation of the next higher upper metal level, the third routing structure 130 can be used for PLY testing and, particularly, to detect defects in any of the test devices connected to the third array 133. Specifically, the third routing structure 130 can be used to test those test devices 190 that are in the third group of test device and that are electrically connected to the metal pads in the third set at the nodes in the link-up regions 134 in the third array 133. This process of using the third routing structure 130 to perform PLY testing can be performed in essentially the same manner as described above with regard to the first routing structure 110 (see processes 22-25 of FIG. 1). Additionally, since, as mentioned above, the third routing structure 130 is formed so as to have essentially the same footprint as the first and second routing structures 110/120 and, particularly, since the metal pads of the third set 131 in the third routing structure 130 are aligned vertically above the metal pads of the lower routing structures, the same probe card can be used for testing with any of the described routing structures. Furthermore, during PLY testing using the third routing structure 130, the additional dummy pads 132 provide protection against probe punch-through down to the metal pads in the second set 121, thereby keeping the third routing structure 130 electrically isolated from the second routing structure 120 and improving structure robustness.

For purposes of illustration, the method is described above as including the formation of three stacked routing structures 110, 120, and 130. However, it should be understood that the method is not intended to be limiting. That is, the method can include the formation of only one or two routing structures. Alternatively, the method can include forming one or more additional routing structures stacked above the third routing structure 130. That is, manufacturing of the IC chips on the semiconductor wafer can continue with formation upper BEOL metal levels until a last metal level (MX) is completed (see process 26 of FIG. 1 and FIG. 8) and, during formation of the upper BEOL metal levels, processes 21-25 can be iteratively repeated. That is, additional routing structures can be formed in the metal levels above third routing structure 130 and the additional routing structure(s) can be used for PLY testing in the same manner as described above.

Figure 8:
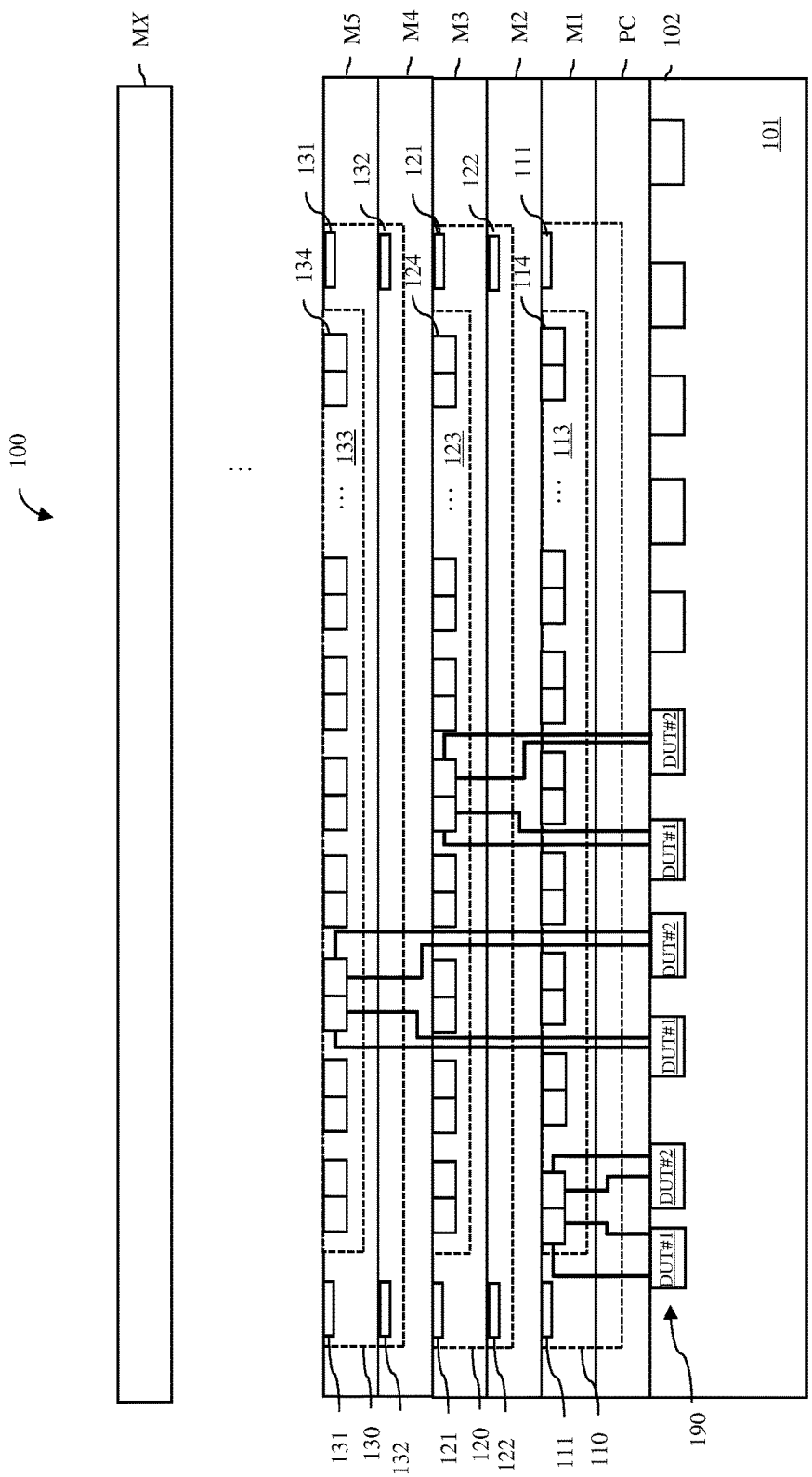

Referring to FIG. 8 also disclosed herein are embodiments of a semiconductor structure 100 formed according to disclosed method. As illustrated and described in detail above, this semiconductor structure 100 can contain multiple test devices 190 and one or more stacked routing structures (e.g., see stacked routing structures 110, 120, and 130), which allow for the performance of process limiting yield (PLY) testing of those test devices 190.

It should be noted that the routing structure(s) and test devices described above can be formed in the integrated circuit (IC) chip regions of the semiconductor wafer. Alternatively, the routing structure(s) and the test devices can be formed in kerf regions (also referred to as scribe lines), which are adjacent to and between the IC chip regions, or in a combination of the IC chip regions and the kerf regions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming semiconductor devices and test devices in a device layer on a semiconductor wafer;
   forming, on the semiconductor wafer, a first routing structure comprising:
      a first array of link-up regions above the device layer, arranged in columns and rows and electrically connected to a first group of the test devices, each link-up region comprising a first section with a first node and a second node electrically connected to a first pair of terminals of a corresponding first test device and a second section adjacent to the first section and having a third node and a fourth node electrically connected to a second pair of terminals of a corresponding second test device; and,
      a first set of metal pads above the device layer and comprising: first pads at a first side of the first array; second pads at a second side of the first array; third pads at a third side of the first array opposite the first side; and, fourth pads at a fourth side of the first array opposite the second side, each column of link-up regions in the first array having a first pad electrically connected to all first nodes in the column and a third pad electrically connected to all third nodes in the column, and each row of link-up regions in the first array having a second pad electrically connected to all second nodes in the row and a fourth pad electrically connected to all fourth nodes in the row; and
   using the first routing structure to test the test devices in the first group.

2. The method of claim 1, the test devices in the first group comprising two-terminal test devices.

3. The method of claim 1, wherein all of the link-up regions in the first array and all of the metal pads in the first set are formed in a specific metal level of the semiconductor wafer and the first routing structure is further formed so as to comprise:
   first wires electrically connecting the first pads to the first nodes;
   second wires electrically connecting the second pads to the second nodes,
   third wires electrically connecting the third pads to the third nodes; and
   fourth wires electrically connecting the fourth pads to the fourth nodes,
      the first wires and third wires being in the specific metal level and parallel to the columns such that each column is positioned laterally between a first wire and a third wire,
      the second wires each comprising upper second wire segments and lower second wire segments, and
      the fourth wires each comprising upper fourth wire segments and lower fourth wire segments.

4. The method of claim 3,
   wherein the upper second wire segments and the upper fourth wire segments are in the specific metal level and parallel to the rows such that each link-up region in each row is positioned laterally between an upper second wire segment and an upper fourth wire segment,
   wherein the lower second wire segments and the lower fourth wire segments are in a lower level of the semiconductor wafer below the specific metal level, and
   wherein vias electrically connect the upper second wire segments to the lower second wire segments and further electrically connect the upper fourth wire segments to the lower fourth wire segments so as to form the second wires and the fourth wires, respectively.

5. The method of claim 4, the lower level of the semiconductor wafer below the specific metal level being any of a lower metal level, a polysilicon level or some other lower level below the polysilicon level.

6. The method of claim 3, further comprising, after the forming of the first routing structure and the using of the first routing structure, forming a first upper metal level above the specific metal level and a second upper metal level above the first upper metal level and, during the forming of the first upper metal level and the second upper metal level, forming dummy pads and a second routing structure,
   the dummy pads being formed in the first upper metal level,
   the second routing structure being formed so as to comprise a second array of link-up regions and a second set of metal pads in the second upper metal level,
   the second array and the second set being aligned above and have essentially a same footprint as the first array and the first set, respectively,
   the link-up regions of the second array being electrically connected to a second group of test devices, and the dummy pads being aligned vertically between the metal pads in the second set and the metal pads in the first set.

7. The method of claim 6, further comprising using the second routing structure to test all test devices in the second group, wherein, during the using of the second routing structure, the dummy pads prevent probes from penetrating down to any of the metal pads in the first set in order to avoid shorts that would impact test results.

8. The method of claim 7, further comprising:
after the forming of the second routing structure and the using of the second routing structure, forming a third upper metal level above the second upper metal level and a fourth upper metal level above the third upper metal level;
during the forming of the third upper metal level and the fourth upper metal level, forming additional dummy pads and a third routing structure,
the additional dummy pads being formed in the third upper metal level,
the third routing structure being formed so as to comprise a third array of link-up regions and a third set of metal pads in the fourth upper metal level,
the third array and the third set being aligned above and have essentially the same footprint as the second array and the second set, respectively,
the link-up regions of the third array being electrically connected to a third group of test devices, and
the additional dummy pads being aligned vertically between the metal pads in the third set and the metal pads in the second set; and,
using the third routing structure to test all test devices in the third group.

9. A method comprising:
forming, on a semiconductor wafer, a first routing structure comprising:
a first array of link-up regions arranged in columns and rows and electrically connected to a first group of test devices, each link-up region comprising a first section with a first node and a second node electrically connected to a first pair of terminals of a corresponding first test device and a second section with a third node and a fourth node electrically connected to a second pair of terminals of a corresponding second test device; and,
a first set of metal pads comprising: first metal pads at a first side of the first array; second metal pads at a second side of the first array; third metal pads at a third side of the first array opposite the first side; and, fourth metal pads at a fourth side of the first array opposite the second side, wherein each column of link-up regions in the first array has a first metal pad electrically connected to all first nodes in the column and a third metal pad electrically connected to all third nodes in the column, and wherein each row of link-up regions in the first array has a second metal pad electrically connected to all second nodes in the row and a fourth metal pad electrically connected to all fourth nodes in the row, the link-up regions of the first array and the metal pads of the first set being formed in a specific metal level of the semiconductor wafer and the first routing structure further being formed so as to comprise:
first wires electrically connecting the first metal pads to the first nodes;
second wires electrically connecting the second metal pads to the second nodes,
third wires electrically connecting the third metal pads to the third nodes; and
fourth wires electrically connecting the fourth metal pads to the fourth nodes,
the first wires and third wires being in the specific metal level and parallel to the columns such that each column is positioned laterally between a first wire and a third wire,
the second wires each comprising upper second wire segments and lower second wire segments, and
the fourth wires each comprising upper fourth wire segments and lower fourth wire segments;
using the first routing structure to test all test devices in the first group, the using of the first routing structure comprising:
selecting a specific column;
testing all first test devices electrically connected to the link-up regions of the specific column by:
applying a first supply voltage to a specific first metal pad that is electrically connected to the first nodes of the link-up regions of the specific column;
leaving all other first metal pads, the third metal pads and the fourth metal pads floating;
connecting the second metal pads to a second supply voltage;
determining first current amounts at each of the second metal pads;
based on the first current amounts, detecting any defects in any of the first test devices that are electrically connected to the link-up regions of the specific column;
testing all second test devices electrically connected to the link-up regions of the specific column by:
applying the first supply voltage to a specific third metal pad that is electrically connected to the second nodes in the link-up regions of the specific column;
leaving all other third metal pads, the first metal pads and the second metal pads floating;
connecting the fourth metal pads to the second supply voltage;
determining second current amounts at each of the fourth metal pads;
based on the second current amounts, detecting any defects in any of the second test devices that are electrically connected to the link-up regions of the specific column; and
iteratively repeating the selecting of the specific column, the testing of the first test devices that are electrically connected to the link-up regions of the specific column and the testing of the second test devices that are electrically connected to the link-up regions of the specific column until all of the columns in the first array are selected and all of the test devices in the first group of test devices are tested.

10. The method of claim 9, the test devices in the first group each comprising two-terminal test devices.

11. The method of claim 9,
wherein the upper second wire segments and the upper fourth wire segments are in the specific metal level and parallel to the rows such that each link-up region in each row is positioned laterally between an upper second wire segment and an upper fourth wire segment,
wherein the lower second wire segments and the lower fourth wire segments are in a lower level of the semiconductor wafer below the specific metal level, and
wherein vias electrically connect the upper second wire segments to the lower second wire segments and further electrically connect the upper fourth wire segments to the lower fourth wire segments so as to form the second wires and the fourth wires, respectively.

12. The method of claim 9, further comprising:
after the forming of the first routing structure and the using of the first routing structure, forming a first upper metal level above the specific metal level and a second upper metal level above the first upper metal level;
during the forming of the first upper metal level and the second upper metal level, forming dummy pads and a second routing structure,
   the dummy pads being formed in the first upper metal level,
   the second routing structure being formed so as to comprise a second array of link-up regions and a second set of metal pads in the second upper metal level,
   the second array and the second set being aligned above and have essentially a same footprint as the first array and the first set, respectively,
   the link-up regions of the second array being electrically connected to a second group of test devices, and
   the dummy pad being aligned vertically between the metal pads in the second set and the metal pads in the first set;
using the second routing structure to test all test devices in the second group, wherein, during the using of the second routing structure, the dummy pads prevent probes from penetrating down to any of the metal pads in the first set in order to avoid shorts that would impact test results;
after the forming of the second routing structure and the using of the second routing structure, forming a third upper metal level above the second upper metal level and a fourth upper metal level above the third upper metal level;
during the forming of the third upper metal level and the fourth upper metal level, forming additional dummy pads and a third routing structure,
   the additional dummy pads being formed in the third upper metal level,
   the third routing structure being formed so as to comprise a third array of link-up regions and a third set of metal pads in the fourth upper metal level,
   the third array and the third set being aligned above and have essentially the same footprint as the second array and the second set, respectively,
   the link-up regions of the third array being electrically connected to a third group of test devices, and
   the additional dummy pads being aligned vertically between the metal pads in the third set and the metal pads in the second set; and,
using the third routing structure to test all test devices in the third group.

13. A semiconductor structure comprising:
a semiconductor wafer;
semiconductor devices and test devices in a device layer on the semiconductor wafer;
a first routing structure comprising:
   a first array of link-up regions above the device layer, arranged in columns and rows and electrically connected to a first group of the test devices, each link-up region comprising a first section with a first node and a second node electrically connected to a first pair of terminals of a corresponding first test device and a second section adjacent to the first section and having a third node and a fourth node electrically connected to a second pair of terminals of a corresponding second test device; and,
   a first set of metal pads comprising: first metal pads at a first side of the first array; second metal pads at a second side of the first array; third metal pads at a third side of the first array opposite the first side; and, fourth metal pads at a fourth side of the first array opposite the second side, wherein each column of link-up regions in the first array has a first metal pad electrically connected to all first nodes in the column and a third metal pad electrically connected to all third nodes in the column, and wherein each row of link-up regions in the first array has a second metal pad electrically connected to all second nodes in the row and a fourth metal pad electrically connected to all fourth nodes in the row.

14. The semiconductor structure of claim 13, the test devices in the first group comprising two-terminal test devices.

15. The semiconductor structure of claim 13, the link-up regions of the first array and the metal pads of the first set being in a specific metal level and the first routing structure further comprising:
   first wires electrically connecting the first metal pads to the first nodes;
   second wires electrically connecting the second metal pads to the second nodes,
   third wires electrically connecting the third metal pads to the third nodes; and
   fourth wires electrically connecting the fourth metal pads to the fourth nodes,
      the first wires and third wires being in the specific metal level and parallel to the columns such that each column is positioned laterally between a first wire and a third wire,
      the second wires each comprising upper second wire segments and lower second wire segments, and
      the fourth wires each comprising upper fourth wire segments and lower fourth wire segments.

16. The semiconductor structure of claim 15,
wherein the upper second wire segments and the upper fourth wire segments are in the specific metal level and parallel to the rows such that each link-up region in each row is positioned laterally between an upper second wire segment and an upper fourth wire segment,
wherein the lower second wire segments and the lower fourth wire segments are in a lower level below the specific metal level, and
wherein vias electrically connect the upper second wire segments to the lower second wire segments and further electrically connect the upper fourth wire segments to the lower fourth wire segments so as to form the second wires and the fourth wires, respectively.

17. The semiconductor structure of claim 15, further comprising:
   a first upper metal level above the specific metal level;
   a second upper metal level above the first upper metal level;
   dummy pads in the first upper metal level; and
   a second routing structure comprising a second array of link-up regions and a second set of metal pads in the second upper metal level,
      the second array and the second set being aligned above and have essentially a same footprint as the first array and the first set, respectively, the link-up regions of the second array being electrically connected to a second group of test devices, and the dummy pads being aligned vertically between the metal pads in the second set and the metal pads in the first set.

18. The semiconductor structure of claim 17, wherein the dummy pads prevent probes from penetrating down to any of the metal pads in the first set during test processes performed using the second routing structure in order to avoid shorts that would impact test results.

19. The semiconductor structure of claim 17, further comprising:

a third upper metal level above the second upper metal level;

a fourth upper metal level above the third upper metal level;

additional dummy pads in the third upper metal level; and a third routing structure comprising a third array of link-up regions and a third set of metal pads in the fourth upper metal level, the third array and the third set being aligned above and have essentially the same footprint as the second array and the second set, respectively, the link-up regions of the third array being electrically connected to a third group of test devices, and the additional dummy pads being aligned vertically between the metal pads in the metal pads in the third set and the metal pads in the second set.

* * * * *